United States Patent
Her

Patent Number: 5,182,696
Date of Patent: Jan. 26, 1993

[54] DISTRIBUTOR FOR TELEVISION SETS

[76] Inventor: Jern-Shong Her, No. 44, Lane 8, Chang Mei Road Sec. 1, Changhua City, Taiwan

[21] Appl. No.: 895,042

[22] Filed: Jun. 8, 1992

[51] Int. Cl.⁵ .............................................. H02B 1/00
[52] U.S. Cl. ................................. 361/380; 174/35 R; 174/35 GC; 361/392; 361/424
[58] Field of Search .................. 174/35 R, 35 GC, 50, 174/50.5, 50.51, 52.3; 361/331, 380, 392, 394–395, 399, 424

[56] References Cited

U.S. PATENT DOCUMENTS

| | | | |
|---|---|---|---|
| 3,193,132 | 7/1965 | Gray | 174/50 |
| 3,910,448 | 10/1975 | Evans et al. | 174/50 |
| 4,623,753 | 11/1986 | Feldman et al. | 174/50 |
| 4,810,830 | 3/1989 | Komine et al. | 361/424 |

Primary Examiner—Gregory D. Thompson
Attorney, Agent, or Firm—Bacon & Thomas

[57] ABSTRACT

A distributor used between an antenna cable and TV sets for relaying and distributing input electric waves to connected TV sets by providing an input connecting means at one side wall to connect the antenna cable and two output connecting means at side wall opposite to the input connecting means, mainly consists of a container and a cover. The container is characterized by side walls which include outer walls, inner thinner walls adjacent to the outer wall, and lower steepled flange inside and adjacent to the thinner walls. The cover is characterized by edges which has chamfered outer edges and reversed V-shaped groove formed around its lower inner edges, and a raised top portion small than the cover in area. The reversed V-shaped groove of the cover may fit into the steepled flange of the container when the cover is covered to the container, allowing the thinner walls of the container to be pressed and bent inward to tightly wrap periphery of the cover and be flush with the raise top portion of the cover.

1 Claim, 2 Drawing Sheets

U.S. Patent         Jan. 26, 1993         Sheet 2 of 2         5,182,696
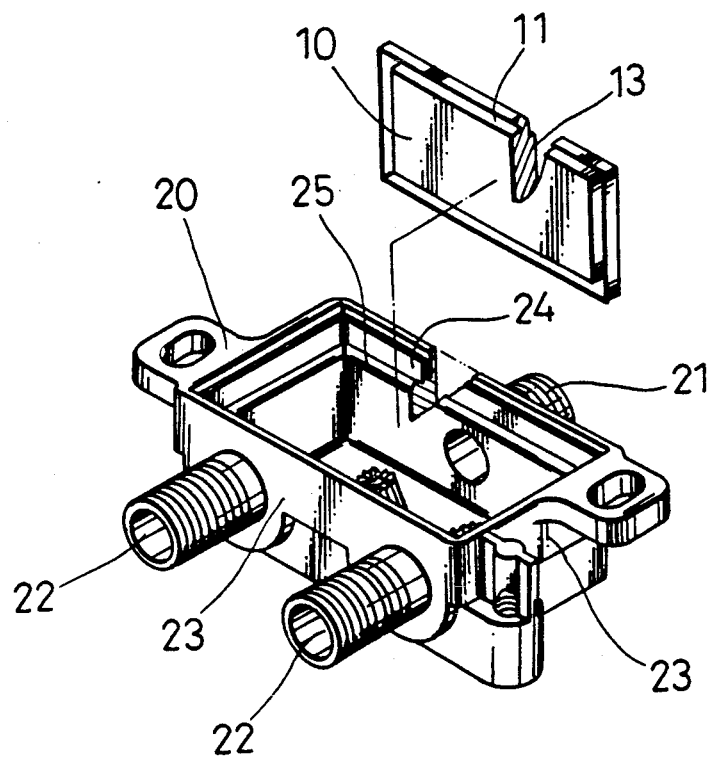
FIG. 3
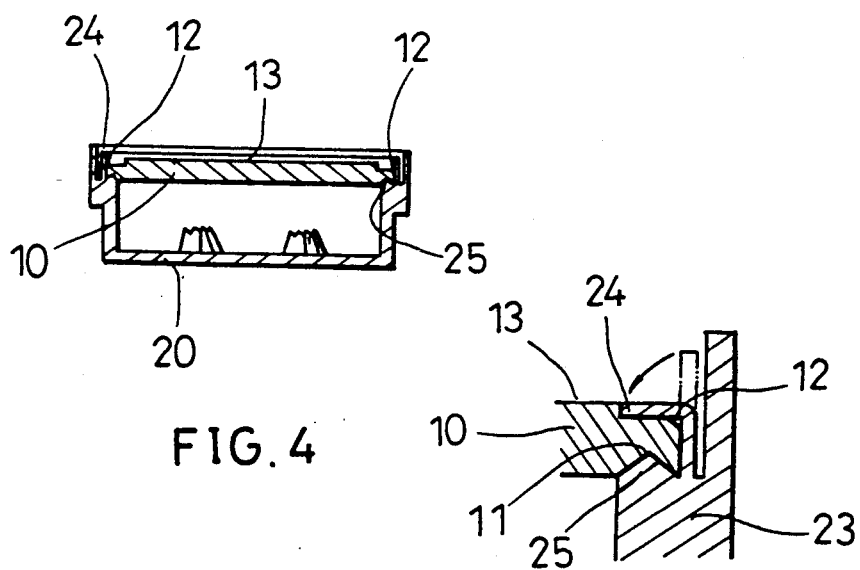
FIG. 4
FIG. 5

DISTRIBUTOR FOR TELEVISION SETS

BACKGROUND OF THE INVENTION

A conventional distributor, as shown in FIG. 1, generally consists of a substantially rectangular container 10 and a substantially rectangular cover 20. There are inner walls 11 upward projected from inside the four outer walls of the container 10 in such a manner that a groove is formed between the outer walls and the inner walls 11 to just receive four downward extended outer portions of edges 21 of the cover 20. The cover 20 has four inner portions of edges 21 that, together with the outer portion of edges 21, form an upward extended recess around just inside the entire periphery of the cover 20. The recess is suitable for just receiving the upward projected inner walls 11 of the container 10. After the cover 20 is closed to the container 10, glue or other kinds of adhesive is used to seal the seam between the cover 20 and the container 10.

The container and cover of a distributor is so designed to facilitate the easy covering of the cover 20 to the container 10 that larger tolerance must be allowed to the sizes of the recess between the inner and the outer portions of the edges 21 of the cover and the groove between the inner and the outer walls of the container 10. However, these larger tolerances also permit electric wave passing the distributor to easily leak out. The electric wave might very possibly leak out of the distributor from the gaps existed between the container and the cover through several times of refraction, as illustrated in FIGS. 2, 2A. On the other hand, the sealing material used to seal the seam between the container and the cover may not be sufficient to prevent such leak. The leaked electrice wave may very possibly interfer the use of other electric appliances, for example, radios, in the same room.

It is therefore tried by the applicant to develop a distributor used between an antenna cable and television sets to relay or distribute incoming electric waves for use by multiple TV sets while waves pass the distributor would not leak therefrom.

SUMMARY OF THE INVENTION

The primary object of the present invention is to provide a distributor used between an antenna cable and TV sets the cover of which can be tightly covered to the container thereof lest electric waves passing therethrough should leak which might very possibly interfer other electric appliances used in the same room.

To achieve the above object, the container of the distributor according to the present invention is designed to have side walls which include outer walls, inner thinner walls adjacent to the outer wall, and lower steepled flange inside and adjacent to the thinner walls; the cover of the distributor has edges which has chamfered outer edges and reversed V-shaped groove formed around its lower inner edges, and a raise top portion small than the cover in area. The reversed V-shaped groove of the cover may fit into the steepled flange of the container when the cover is covered to the container, allowing the thinner walls of the container to be pressed and bent inward to tightly wrap periphery of the cover and be flush with the raised top portion of the cover. With these cover and container of the distributor so designed, electric waves passing the distributor will not leak from the distributor.

BRIEF DESCRIPTION OF THE DRAWINGS

FIG. 3 is a three-dimensional perspective of an embodiment of a distributor according to the present invention;

FIG. 4 is a sectional view of the distributor as illustrated in FIG. 3; and

FIG. 5 is an enlarged, fragmentary, sectional view showing the manner in which the cover and the container of the distributor according to the present invention is sealed.

DETAILED DESCRIPTION OF THE PREFERRED EMBODIMENTS

Figure 1:
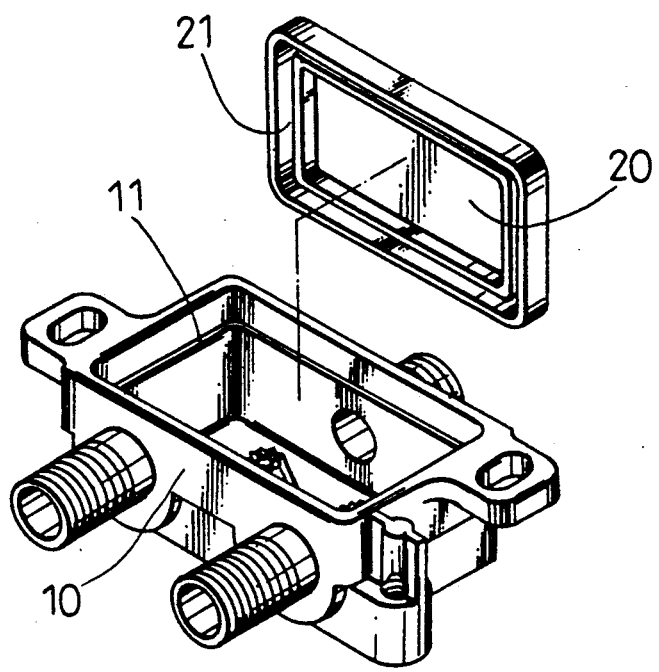
FIG. 1 is a three-dimensional perspective of a conventional distributor.
Figure 2:
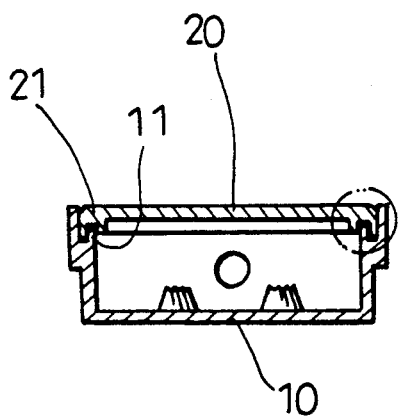
FIG. 2 is a sectional view of the conventional distributor as illustrated in FIG. 1.
Figure 2A:
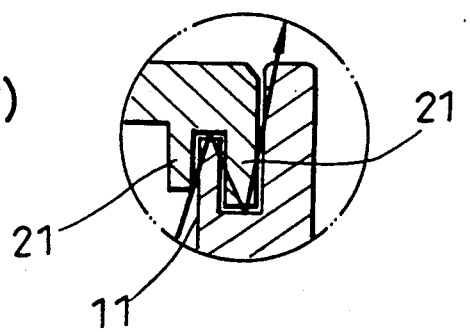
FIG. 2A is an enlarged, fragmentary, sectional view showing the manner in which the cover and the container of the conventional distributor is joined.

Please refer to FIG. 3 in which an embodiment of the distributor according to the present invention is illustrated.

The distributor consists of a substantially rectangular cover 10 and a substantially rectangular container 20. An input connecting member 21 is provided at one side wall of the container 20 for connecting an antenna cable, and two output connecting members 22 are provided at another side wall opposite to the input connecting member 21 for connecting wires to TV sets. Electric waves received from the antenna is relayed and distributed via the output connecting members 22 to at least two TV sets connected thereto.

A circle of thinner walls 24 which is formed just inside and around four outer walls 23 of the container 20 constitutes a substantially rectangular upward projected frame. Moreover, a lower flange with steepled top 25 is further formed just inside and arround the thinner walls 24 near the root of the thinner walls 24.

The cover 10 is so designed to have reversed V-shaped grooves 11 formed around and adjacent to its bottom inner edges, four chamfered top edges 12, and a raised top portion 13 which is smaller in area than the cover 10 and has a thickness the same as that of the thinner walls 24 of the container 20. The reversed V-shaped grooves 11 shall fit into the steepled flange 25 when the cover 10 is positioned on the container 20 as shown in FIG. 4. After the cover 10 is adequately positioned, the thinner walls 24 are pressed and bent inwardly to seal the periphery of the cover 10, and be flush with top surface of the raised top portion 13, as shown in FIG. 5. Since the means used to seal the cover 10, i.e., the thinner walls 24, is a part of the container 20 that is made of the same metal as that for the cover 10, it ensures the tight close of the cover 10 over the container 20, preventing any electric waves from leaking out of the distributor.

What is claimed is:

1. A distributor for television sets comprising a substantially rectangular container and a substantially rectangular cover corresponding to said container;

said container having an input connecting means for connecting an antenna cable thereto provided at one of its side walls and two output connecting means for connecting wires to TV sets thereto provided at another side wall opposite to said one side wall on which said input connecting means is provided;

said side walls of said container including four outer walls, a circle of thinner walls which is formed just inside and around said four outer walls to constitute a substantially rectangular upward projected frame, and a lower flange with steepled top formed just inside and around said thinner walls near the root of said thinner walls;

said cover having reversed V-shaped grooves formed around and adjacent to bottom inner edges of said cover, four chamfered top edges, and a raised top portion which is smaller in area than said cover and has a thickness the same as that of said thinner walls of said container;

said reversed V-shaped grooves fitting onto said steepled top when said cover is positioned on said container; and said thinner walls pressed and bent inward to seal the entire periphery of said cover after said cover is positioned on said container, and said bent thinner walls being flush with the top surface of said raised top portion of said cover.

* * * * *